United States Patent
Chan

(10) Patent No.: US 6,710,637 B1
(45) Date of Patent: Mar. 23, 2004

(54) NON-OVERLAP CLOCK CIRCUIT

(75) Inventor: Wai Cheong Chan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/134,832

(22) Filed: Apr. 29, 2002

(51) Int. Cl.[7] .............................................. H03K 3/037

(52) U.S. Cl. ..................... 327/259; 327/258; 327/239

(58) Field of Search ................................. 327/259, 231, 327/258, 239, 237

(56) References Cited

U.S. PATENT DOCUMENTS

| | | | |
|---|---|---|---|
| 4,547,684 A | 10/1985 | Pechar | 327/259 |
| 5,638,542 A | 6/1997 | Nikjou | 713/323 |
| 5,670,904 A | * 9/1997 | Monoley et al. | 327/277 |
| 5,867,453 A | 2/1999 | Wang et al. | 327/269 |
| 5,977,809 A | 11/1999 | Wang et al. | 327/239 |
| 6,094,081 A | * 7/2000 | Yanagiuchi | 327/258 |
| 6,246,278 B1 | * 6/2001 | Anderson et al. | 327/295 |

* cited by examiner

Primary Examiner—Dinh T. Le
(74) Attorney, Agent, or Firm—Jurgen Vollrath

(57) ABSTRACT

In a non-overlap clock generator circuit providing two-phase clock signals, the clock-to-Q delay of memory elements is used to define the non-overlap times. The non-overlap time can be programmed in increments of the clock-to-Q delay of a standard memory element.

9 Claims, 7 Drawing Sheets

(Pri r Art)**

NON-OVERLAP CLOCK CIRCUIT

FIELD OF THE INVENTION

The invention relates to the field of clock generators for electronic circuits. In particular, the invention deals with a clock circuit for generating two clock signals that are phase shifted and in which either the positive or the negative parts of the signals do not overlap.

BACKGROUND OF THE INVENTION

Digital electronic circuits typically require one or more clock signals to maintain the timing of signals through the circuit. In the case of a shift register, such as the one illustrated in FIG. 1, latches are commonly connected in series and data is shifted through from one latch to the next. As can be seen from FIG. 1, the shift register circuit 100 has two latches (or flip-flops )102, 104 each with its own clock input CLK1 112, and CLK2 114, respectively, which shift data through the latches. The data, Din on input line 116 is shifted through the latch 102 when CLK1 112 is high to emerge after a certain time delay as Dint, and shifts through latch 104 when CLK2 114 is high to emerge after some time delay from the second latch 104 as Dout. This is represented in FIG. 2 by the timing diagrams. At time t1 the first clock CLK1 112 goes high causing data sitting on Din line 116 to shift to the output of latch 102 as shown by the Dint signal in FIG. 2 changing from data1 to data2. When CLK2 goes high at time t2 the data at the input to latch 104 is shifted through to its output. Thus data2 at Dint shifts through to Dout.at time t2.

In practice, however, circuits include parasitic capacitance and resistance, which is depicted in FIG. 3 by capacitor 300 and resistor 306. This causes a time delay in the clock signal CLK2, resulting in a delayed clock CLK2' to the latch 304. This can have severe consequences in the propagation of the data through the shift register, as shown in the timing diagrams in FIG. 4. As before, data Din is shifted through the first latch 302 at time t1. However, now CLK2 is delayed and appears as CLK2' which thus remains high till after the transition of CLK1 going high. As a result, data2, which has been shifted through to the output of latch 302 at t1, continues to be shifted through latch 304 since latch 302 is still being presented by a high clock signal from the delayed clock pulse. Thus, immediately after t1, the data appearing at the output Dout is data2 instead of data1, because CLK2 has been skewed. One approach to avoiding the above condition is to provide for non-overlapping clock signals. A prior art non-overlap clock generator is shown in FIG. 5. Two cross-couple NAND gates 500, 502 are connected to a clock input signal (clock) 504 and are provided with delay lines 510, 512, respectively to generate two non-overlap clock signals, CLK1, CLK2 at outputs 520, 522, respectively. An inverter 530 ensures two different phases for the two clock signals, while the delay lines and propagation delays through the NAND gates ensure non-overlap, as will become clearer from the timing diagrams of FIG. 6. For ease of understanding, letters have been added to FIG. 5 and timing diagrams are provided for these various sections of the circuit. The clock input signal (clock) 504 is inverted by inverter 530 as shown by the signal A. After a short time delay caused by the propagation delay through the NAND gate 500, the negative output of the NAND gate 500 toggles as shown by the signal B. This output signal from NAND gate 500 is fed to the input of NAND gate 502 via a resistance path or delay line 512 to result in a delayed version of the signal B, delayed by a time d1 as shown by signal C. The positive signal together with the positive clock input results in a low signal at the output of the NAND gate 502, and is delayed through the NAND gate 502 by a time d2 as shown by signal D. This signal is, in turn fed back to an input of the NAND gate 500 via a delay line 510, resulting in a delay in the signal as indicated by signal E. The CLK1 output goes low when either or both of the inputs to the NAND gate 500 are low. This happens when the positive pulse of the clock input signal is inverted by the inverter 530. Thus, taking the clock input going high as the starting point, after a delay determined by the inverter 530, NAND gate 500 and inverter 534, CLK1 goes low. For CLK2 to go high, both inputs to NAND gate 502 must be high. The clock input is high but C is delayed by the signal moving through the inverter 530, NAND gate 500 and delay line 512. As shown by the delay d1, the delay at C is caused largely by the delay line 512. CLK2 then goes high after an additional delay through the NAND gate 502 and inverter 532. Thus CLK 2 going high is delayed for some time after CLK1 went low. CLK2 again goes low due to either input of NAND gate 502 going low. Most importantly, though, CLK1 must not go high until after CLK2 has gone low. This is ensured by the time delay d3. For CLK1 to go high, both inputs to NAND gate 500 must be high. Thus the clock input going low is not enough. Input E also has to go high. Since input E emanates from output D of NAND gate 502 and is fed through the delay line 510, the delay line ensures that CLK 1 will not go high before CLK 2 has gone low.

Thus the delay lines 510, 512 are critical to the functioning of the circuit. If they are chosen too small, the clock skew may so great as to cause malfunction of the system. If they are chosen too large, the active states (or cycle time) of CLK1 and CLK2 will be decreased substantially. This requires the periods of the clock signals CLK1 and CLK2 to be increased to ensure that the active period remains long enough, which, in turn slows down the signals and degrades the performance of the circuit.

One prior art circuit makes use of NAND or NOR gates to produce the two output clock signals and a selectable number of inverters as the delay elements in the circuit. However, even the slowest standard library inverter cells do not have much delay. Furthermore, it is not necessary or useful to have that type of resolution in tuning the non-overlap time. Also, if the inverters are not standard elements, one would have to do SPICE simulations to characterize the circuit over all process corners, temperatures and supply variations.

Another prior art circuit makes use of a depletion mode device for producing one clock output and connecting the input and output of the device to a NOR gate to produce the other clock output. However, this requires the use of special depletion mode devices, which are not readily available when using standard processes.

The present invention provides a non-overlap clock generator circuit using standard library components which are fully characterized. The resolution of the non-overlap delay is in the order of clock-to-Q delay of a flip-flop, which provides sufficient non-overlap time without cutting too much into the cycle time.

SUMMARY OF THE INVENTION

The invention provides a non-overlap clock circuit that uses programmable delay circuits in the form of flip-flops for ensuring that either the low or the high portions of the output clock signals do not overlap.

According to the invention there is provided a non-overlap clock circuit, comprising a first flip-flop providing a first clock output from its non-inverted output, a second flip-flop providing a second clock output from it inverted output, wherein the first flip-flop and second flip-flop are triggered by a common input clock signal and are set up to toggle in response to the input clock signal, a first feedback loop from the first clock output to control the triggering of the second flip-flop, and a second feedback loop from the second clock output to control the triggering of the first flip-flop, wherein the first and second feedback loops include programmable delay circuits. Each programmable delay circuit may include a set of flip-flops defining a delay path, with the output of each previous flip-flop feeding the clock input of the next flip-flop, each flip-flop introducing a propagation delay through the flip-flop, wherein any number of the flip-flops can be selected for inclusion in the delay path. The outputs of the flip-flops are typically connected together using transmission gates, wherein the flip-flops are selected for inclusion in the delay path by selecting the corresponding transmission gates using control logic. The non-overlap circuit may include an edge detector providing the common input clock.

Further, according to the invention, there is provided a non-overlap clock circuit that provides a first and a second clock signal in which either the low or high portions of the signals do not overlap, the circuit including programmable delay circuits for delaying the transition of a first signal to a first state for some time after the second signal has gone to the second state, and delaying the transition of the second signal to the first state for some time after the first signal has gone to the second state, wherein each programmable delay circuit includes a set of flip-flops defining a delay path, with the output of each previous flip-flop feeding the clock input of the next flip-flop, each flip-flop introducing a propagation delay through the flip-flop, wherein any number of the flip-flops can be selected for inclusion in the delay path.

DETAILED DESCRIPTION OF THE INVENTION

Figure 1:
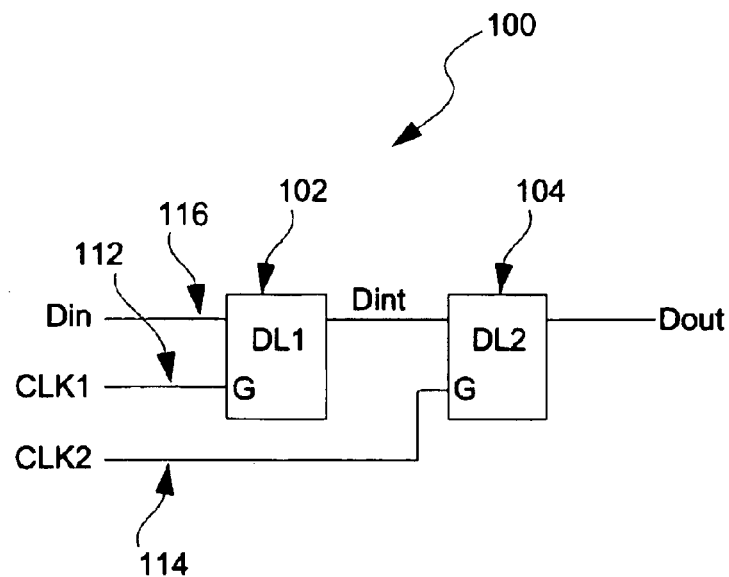
FIG. 1 is a simplified schematic circuit diagram of a prior art shift register.
Figure 2:
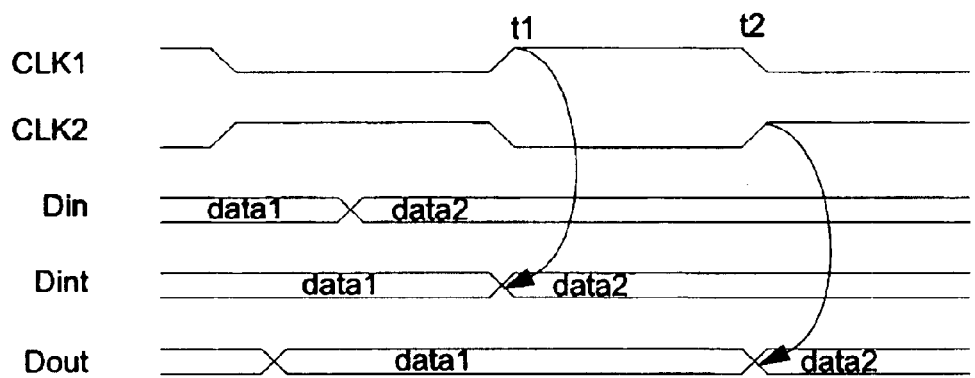
FIG. 2 is a timing diagram for the shift register of FIG. 1.
Figure 3:
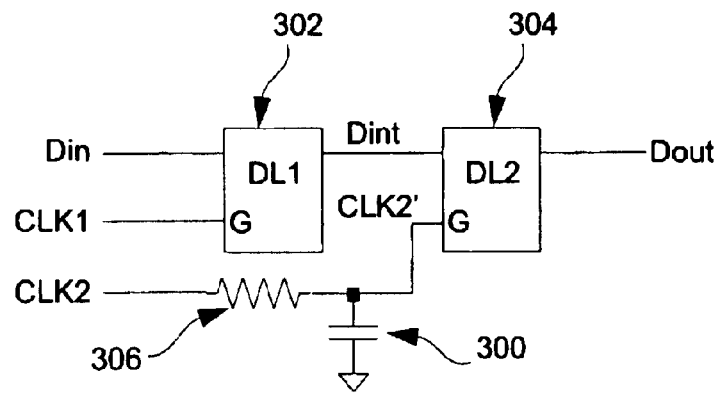
FIG. 3 is schematic circuit diagram of a prior art shift register, depicting the parasitic capacitance and resistance.
Figure 4:
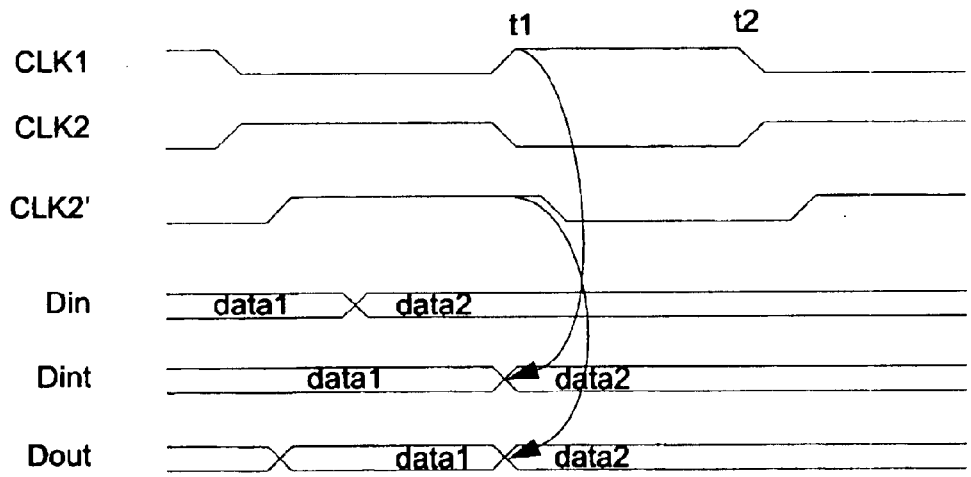
FIG. 4 is a timing diagram of the shift register of FIG. 3.
Figure 5:
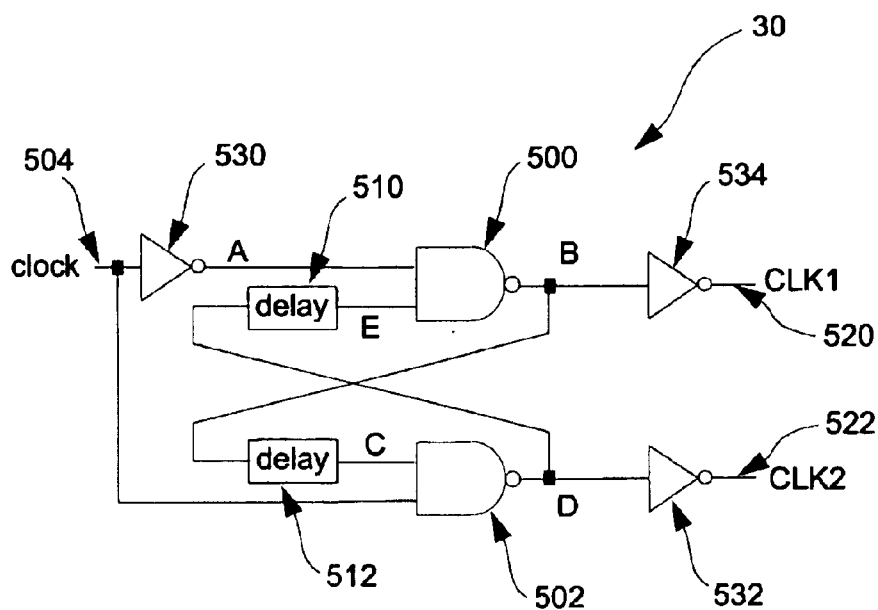
FIG. 5 is schematic circuit diagram of a prior art non-overlap clock generator.
Figure 6:
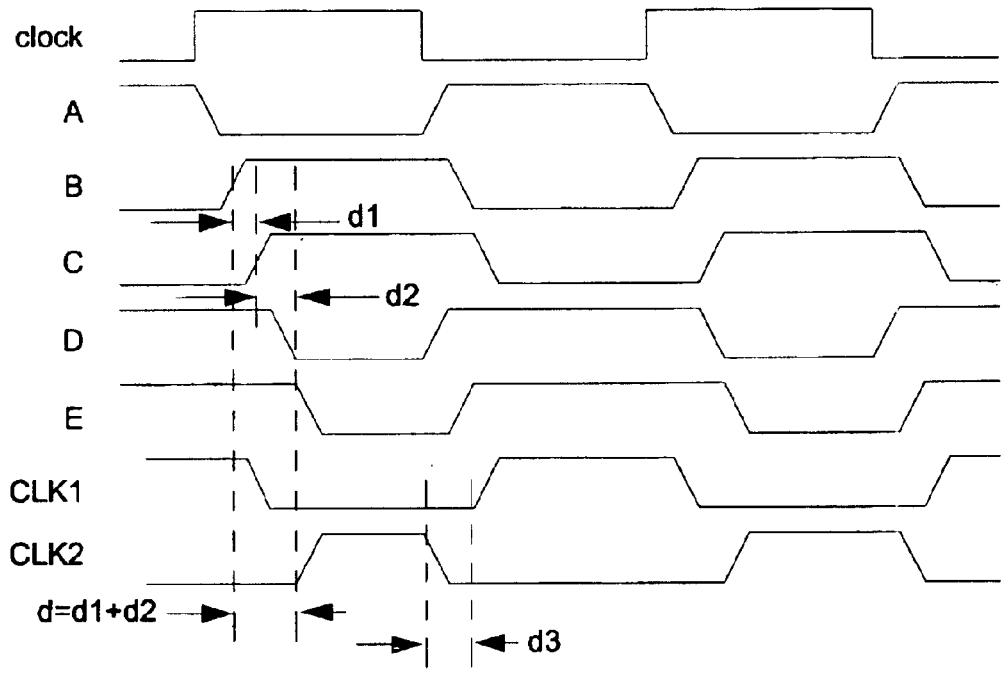
FIG. 6 is a timing diagram for the generator of FIG. 5.
Figure 7:
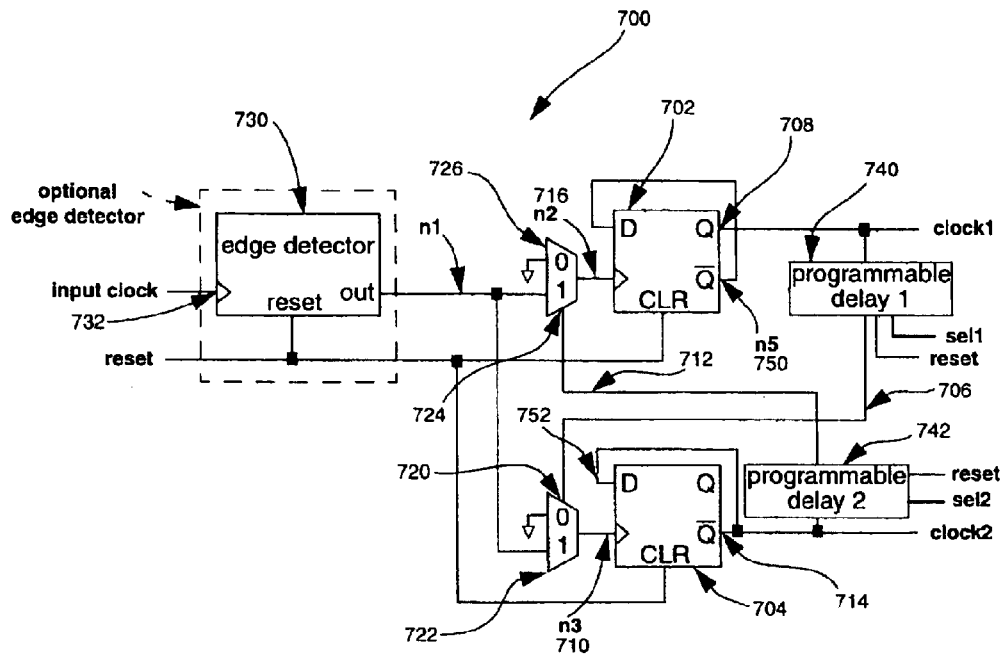
FIG. 7 is schematic circuit diagram of one embodiment of a programmable non-overlap clock generator of the invention.

FIG. 7 shows one embodiment of non-overlap clock circuit 700 with programmable delays. It includes a first flip-flop 702 and a second flip-flop 704 which are cross-coupled through the multiplexers 722, 726. A feedback loop 706 from the output 708 of the first flip-flop 702 controls the clock input 710 of the second flip-flop 704, while a feedback loop 712 from the inverted output 714 of the second flip-flop 704 controls the clock input 716 of the first flip-flop 702. The feedback loop 706, in fact, controls a select input 720 of a multiplexer 722, while the feedback loop 712 controls the select input 724 of a multiplexer 726. One input of each of the multiplexers 722, 726 is fed by an input clock while the other input of each of the multiplexers is grounded. Thus when the select input is high the input clock is fed through to the output of the multiplexer. When the select input is low, the low signal of the grounded input is fed through to the output.

In this embodiment, an edge detector 730 is included for producing a clock pulse on both the rising and the falling edge of the input clock 732, as will be discussed in greater detail below. The edge detector thus has the effect of doubling the input clock frequency. It will be appreciated that if the input clock has a sufficiently high frequency for the particular application, it can be applied directly to the inputs of the mulitplexers 722, 726 without the need for an edge detector.

The present embodiment of the non-overlap clock circuit also includes programmable delay circuits 740, 742 in the feedback loops 706, 712, respectively. These will also be discussed in greater detail below.

Figure 8:
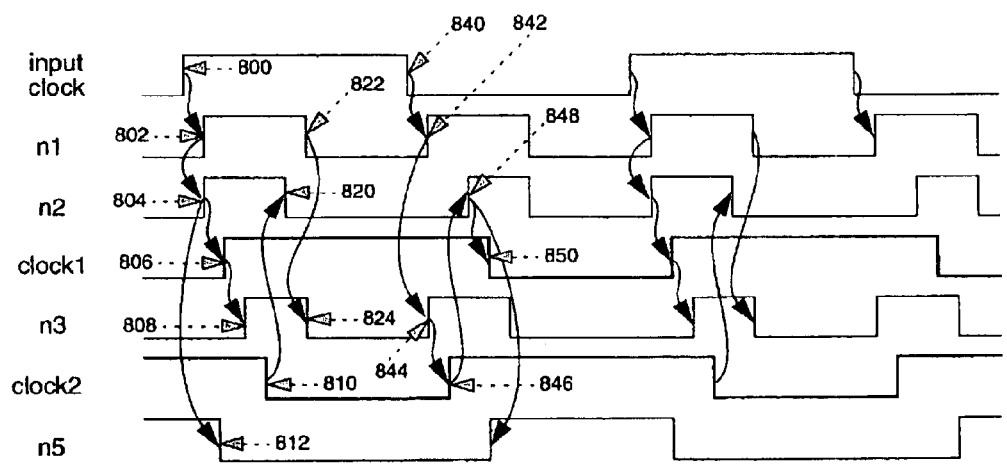
FIG. 8 is a timing diagram for the generator circuit of FIG. 7.

The working of the non-overlap clock circuit is best understood with reference to the timing diagram of FIG. 8. Initially all flip-flops are reset to low. On the rising edge 800 of the input clock 732, the rising edge 802 of the clock signal (n1) presented to the multiplexers is fed through the multiplexer 726 since the inverted output of the second flip-flop 704 (which also forms the second output clock signal (clock 2)) is high. Thus the signal (n2) at the clock input 716 to the first flip-flop 702 experiences a rising edge 804. Since the inverted output 750 of the flip-flop 702 is high, the rising edge of the clock input sets the flip-flop 702, as indicated by the rising edge 806 of the clock1 signal. The positive Q-output 708 is fed to the select input 720 of the multiplexer 722 for the second flip-flop 704. This causes the clock signal to be fed through the multiplexer 722. The rising edge 808 of the signal (n3) presented to the clock input 710, causes the flip-flop 704 to be set since the flip-flop's input 752 is fed by the inverted output, which is currently high. This causes the clock2 signal, which is connected to the inverted output of the second flip-flop 704, to go low (falling edge 810). Thus clock2 goes low only after clock1 has gone high. Consequently there can be no overlap of the two output clock signals at the rising edge of the input clock. Furthermore, it will be appreciated that the non-overlap delay can be adjusted by adjusting programmable delay 740.

Also, as is seen by the waveform n5, the clocking of the first flip-flop 702 not only sets the Q-output to cause clock1 to go high, it also presents a falling edge 812 at the inverted output.

The falling edge 810 of the clock2 signal is fed back to the select input 724 of multiplexer 726, causing the grounded input to be fed through the multiplexer and causing n2 to go low, as shown by the falling edge 820. When the clock signal n1 goes low (falling edge 822) a falling edge 824 is also presented at the output of multiplexer 720.

Figure 9:
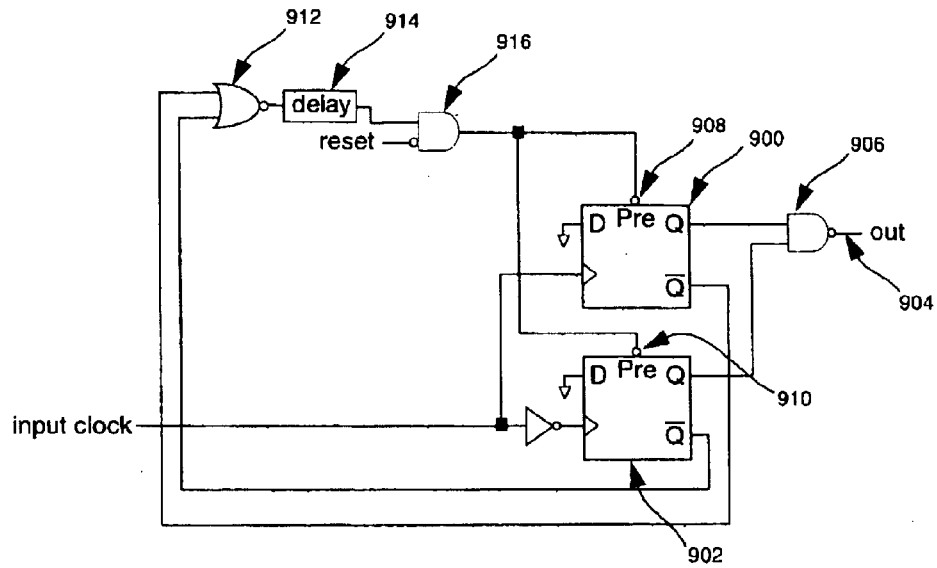
FIG. 9 is a schematic circuit diagram of an edge detector in the generator circuit of FIG. 7.

On the falling edge 840 of the input clock, a new rising edge 842 is provided by the edge detector 730. This is fed through multiplexer 722 since the select input 720 is held high by the clock1 signal. Thus n3 goes high (rising edge 844), causing clock2 to toggle and go high (rising edge 846). The feedback loop 712 selects the select input 724 so that n2 follows n1 to go high as shown by the rising edge 848. This, however, only happens after a time delay as provided by the programmable delay 742. Since clock1 was high and the input to the first flip-flop 702 is connected to the inverted output, the clocking of the first flip-flop toggles the output to cause clock1 to go low (falling edge 850). Thus clock1 cannot go low until clock2 has gone high. Therefore there can be no overlap of the two output clock signals at the falling edge of the input clock. Furthermore, it will be appreciated that the delay between clock2 going high and clock 1 going low, can be adjusted by adjusting the programmable delay 742. One embodiment of an edge detector that can be used in the circuit of FIG. 7, is shown in FIG. 9. It includes two flip-flops 900, 902, the inputs of which are tied to ground. On a positive edge of the input clock, flip-flop 900 is reset, and on a negative edge of the input clock flip-flop 902 is reset. In either case the output 904 will go high. The output 904 again goes low when both inputs to the NAND gate 906 are high, which occurs when the two flip-flops are preset by feeding a low signal to the preset pins 908, 910. Thus, when either of the flip-flops 900, 902 is reset, the inverted input is set and causes the output of the NOR gate 912 to go low. After a time delay, determined by delay element 914, this low is fed through the AND gate 916 to preset the flip-flops. Thus on both the rising and falling edge of the input clock, the output 904 goes high and then, after a time delay, goes low again.

Figure 10:
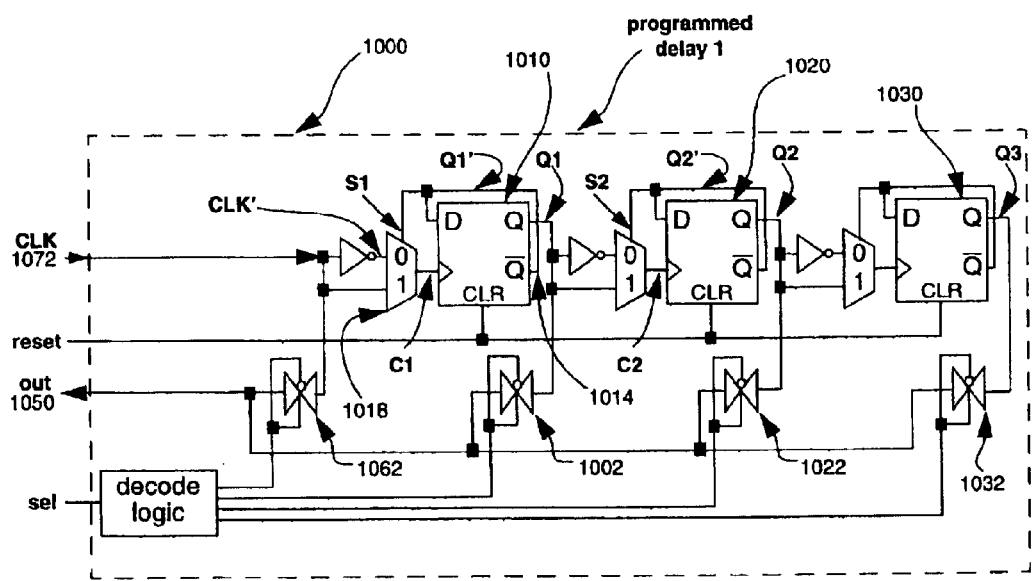
FIG. 10 is a schematic circuit diagram of one embodiment of a programmable delay in the generator circuit of FIG. 7.
Figure 11:
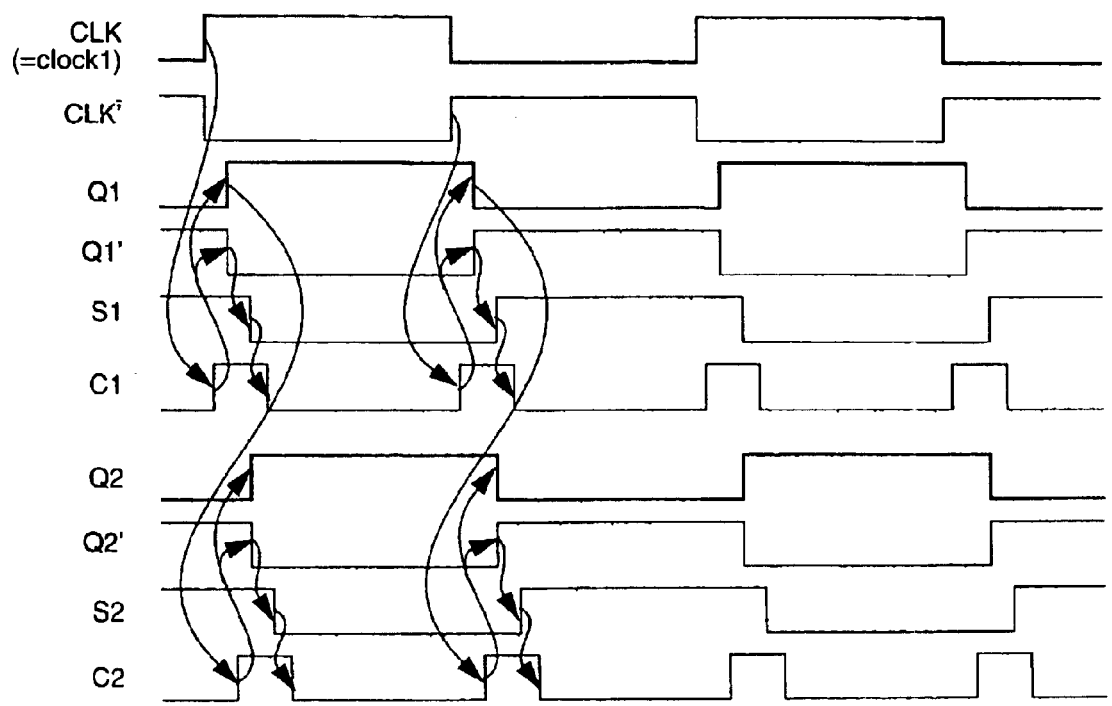
FIG. 11 is a timing diagram for the programmable delay of FIG. 10.

One embodiment of a programmable delay circuit 1000 for use as the programmable delay 740 in the circuit of FIG. 7 is shown in FIG. 10, and the corresponding timing diagram for the first two flip-flops is shown in FIG. 11. The programmable delay circuit 1000 has three flip-flops 1010, 1020, 1030, the outputs of which are connected to an output 1050 by means of transmission gates 1002, 1022, 1032. Also, the input 1072 is connected to the output 1050 by a transmission gate 1062. By means of the decode logic block shown in FIG. 10, one of the transmission gates can be selected to include a particular number of the flip-flops in the delay circuit.

Initially the circuit 1000 is reset to clear the Q-outputs and set the inverted outputs. The clock input 1072 is shown by signal CLK, which is clock 1 in FIG. 7. Since it is inverted by inverters to each flip-flop, the inverted signal CLK' is also shown. Since the inverted output of each flip-flop is connected to the input of the flip-flop, it causes the flip-flops to toggle with each clock pulse. Initially the inverted output 1014 is set and will present a high to the input 1016 and to the select input of the multiplexer 1018. Thus the clock input C1 to flip-flop 1010 will follow CLK. The rising edge of C1 causes the flip-flop 1010 to toggle, thereby causing output Q1 to change state from low to high. In turn, inverted output Q1' goes low, thereby changing the selection on the multiplexer 1018. Thus C1 goes low, since CLK' is low. This completes the state transition for Q1 on the rising edge of CLK.

Meanwhile, when Q1 changes state, it triggers a similar sequence of events for Q2. However, as can be seen from the timing diagram of FIG. 10, Q1 is delayed from CLK and Q2 is, in turn, delayed from Q1. This is largely due to the clock-to-Q delay of the flip-flops.

On the falling edge of CLK, C1 follows CLK' since Q1' is low. Thus C1 becomes a rising edge, causing the flip-flop 1010 to toggle. Thus Q1 goes low and Q1' goes high. The select input to the multiplexer 1018 therefore goes high since it is tied to Q1'. This causes CLK to be fed through the multiplexer, causing C1 to go low. This completes the state transition for Q1 on the falling edge of CLK. Again Q1 propagates to Q2 which propagates to Q3. By selectively turning on the appropriate transmission gates in the programmed delay circuit 1000, the delay can be adjusted since each flip-flop in the delay circuit 1000 adds an additional delay.

While the select signal S1, S2, etc. of the multiplexers were shown to be identical to the inverted outputs from the flip-flops, some tuning of these timing paths may be necessary to ensure sufficient pulse width.

Figure 12:
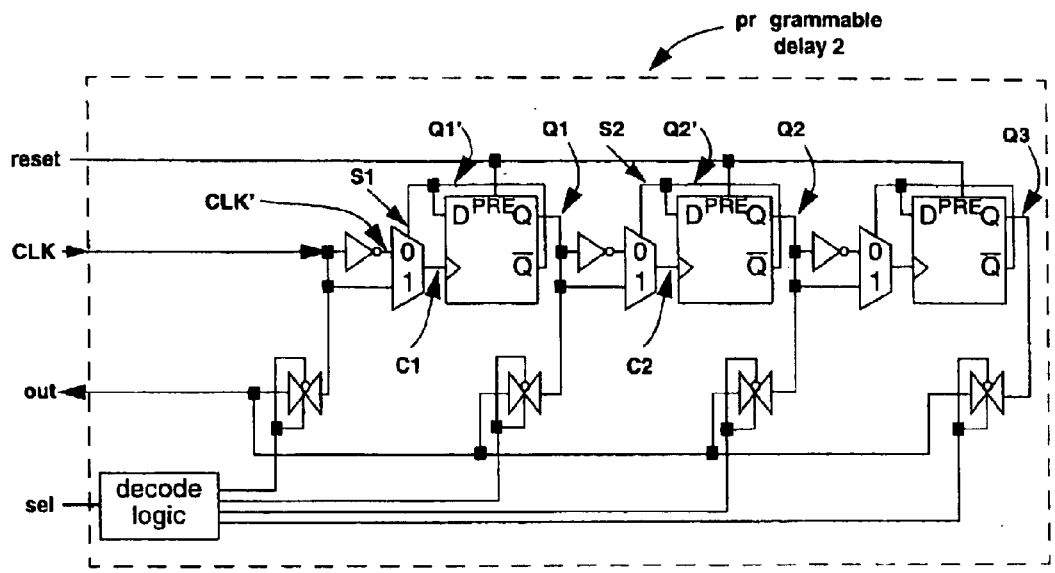
FIG. 12 is a schematic circuit diagram of one embodiment of a programmable delay in the generator circuit of FIG. 7.
Figure 13:
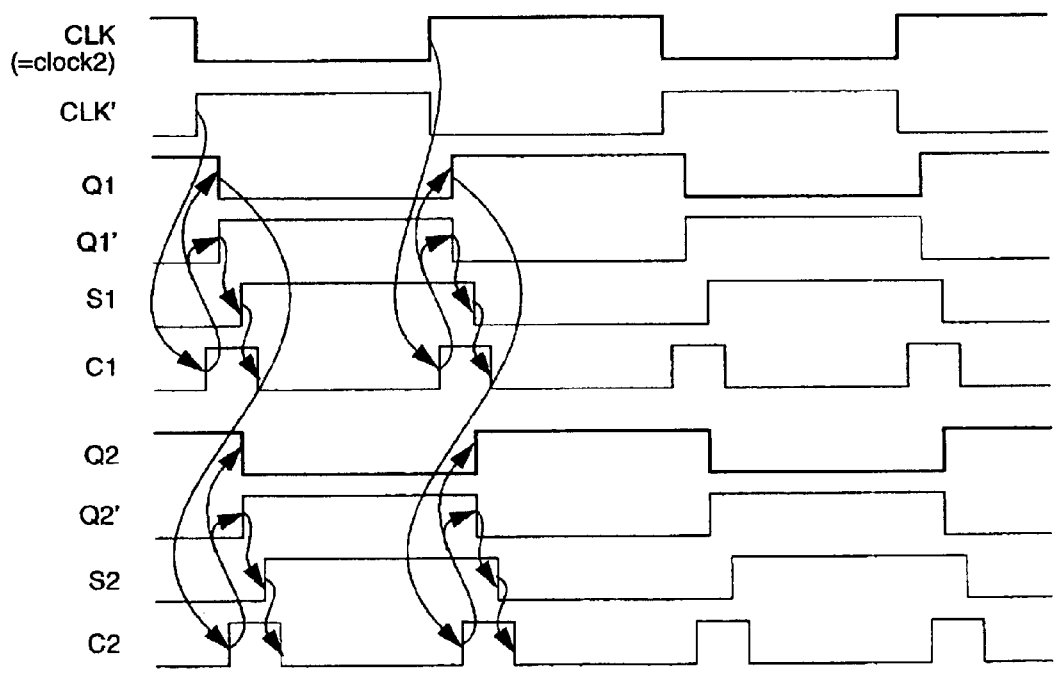
FIG. 13 is a timing diagram for the programmable delay of FIG. 12.

One embodiment of a programmable delay circuit 1200 for use as programmable delay 742 is shown in FIG. 12 and the timing diagram for the first two flip-flops is given in FIG. 13. The circuit and its operation is very similar to that of FIG. 10, but the reset is used to preset all the flip-flops (i.e. set all outputs to high) because clock2 is out of phase with clock1. Thus the operation of the circuit 1200 is substantially the same as that of the circuit 1000, except that the polarity of some of the signals is reversed.

While the invention has been described with respect to specific embodiments, it will be appreciated that the invention can be implemented in different ways without departing from the scope of the invention as defined in the claims. For instance, the embodiment of FIG. 7 provided for non-overlap of the low portions of the clock pulses clock1 and clock2. Another embodiment could be implemented in which the high portions do not overlap.

What is claimed is:

1. A non-overlap clock circuit providing two non-overlapping clock outputs, comprising a first flip-flop having a non-inverted output, providing a first clock output from its non-inverted output, a second flip-flop having an inverted output providing a second clock output from its inverted output, wherein the first flip-flop and second flip-flop are triggered by a common input clock signal and are set up to toggle in response to the input clock signal, a first feedback loop from the first clock output to control the triggering of the second flip-flop, and a second feedback loop from the second clock output to control the triggering of the first flip-flop.

2. A circuit of claim 1, wherein the first and second feedback loops include programmable delay circuits.

3. A circuit of claim 2, wherein each programmable delay circuit comprises a set of flip-flops defining a delay path, with the output of each previous flip-flop feeding the clock input of the next flip-flop, each flip-flop introducing a propagation delay through the flip-flop, the circuit further comprising means for selecting any number of the flip-flops for inclusion in the delay path.

4. A circuit of claim 3, wherein the outputs of the flip-flops of the delay circuit are connected together using transmission gates, and wherein said flip-flops are selected for inclusion in the delay path by selecting the corresponding transmission gates using control logic.

5. A circuit of claim 1, further including an edge detector providing the common input clock signal.

6. A method of generating two clock signals while preventing the overlap of either the low or high portions of the two clock signals, comprising feeding an incoming clock signal through two cross-coupled clock-generator flip flops that are cross coupled by means of two feedback loops, tapping off two clock signals from the clock-generator flip-flops, and selectively delaying each of the tapped-off clock signals by means of delay lines, wherein each delay line comprises at least one flip-flop, the number of flip-flops in each delay line being selectable.

7. A method of claim 6, wherein one of said delay lines is included in each of the feedback loops.

8. A method of claim 7, wherein at least one of the delay lines includes a plurality of flip-flops that are programmably selected for inclusion in the delay line.

9. A method of claim 8, wherein the incoming clock signal is established by feeding an originating clock signal through an edge detector to provide an incoming clock signal of twice the frequency of the originating clock signal.

* * * * *